US012593435B2

(12) United States Patent
Hu et al.

(10) Patent No.: US 12,593,435 B2
(45) Date of Patent: Mar. 31, 2026

(54) eDRAM AND METHOD FOR MAKING SAME

(71) Applicant: Hangzhou HFC Semiconductor Co., Hangzhou (CN)

(72) Inventors: Mingyu Hu, Dalian (CN); Liang Li, Singapore (SG); Huang Liu, Mechanicville, NY (US)

(73) Assignee: Hangzhou HFC Semiconductor Co., Hangzhou (CN)

( * ) Notice: Subject to any disclaimer, the term of this patent is extended or adjusted under 35 U.S.C. 154(b) by 385 days.

(21) Appl. No.: 18/508,912

(22) Filed: Nov. 14, 2023

(65) Prior Publication Data

US 2025/0120060 A1     Apr. 10, 2025

(30) Foreign Application Priority Data

Oct. 10, 2023     (CN) .......................... 202311314986.5

(51) Int. Cl.
H10B 12/00         (2023.01)

(52) U.S. Cl.
CPC ................................ H10B 12/0387 (2023.02)

(58) Field of Classification Search
CPC .......................... H10B 12/0387; H10B 12/038; H10B 12/488; H10B 12/37; H10B 12/01
See application file for complete search history.

(56) References Cited

U.S. PATENT DOCUMENTS

| | | | |
|---|---|---|---|
| 8,673,729 B1 | 3/2014 | Basker et al. | |
| 8,946,802 B2 | 2/2015 | Basker et al. | |
| 2010/0117132 A1* | 5/2010 | Chou ..................... | H10D 1/714 |
| | | | 257/302 |
| 2010/0213523 A1* | 8/2010 | Cheng .................. | H10D 86/201 |
| | | | 438/246 |

* cited by examiner

*Primary Examiner* — Wasiul Haider
(74) *Attorney, Agent, or Firm* — MUNCY, GEISSLER, OLDS & LOWE, P.C.

(57)         ABSTRACT

An eDRAM and a method for making it are disclosed. In the method, a pad oxide layer and a pad nitride layer formed over a surface of a substrate are removed after an active area and a deep trench filled with polysilicon are formed, followed by the formation of a re-deposited oxide layer and a re-deposited nitride layer. The re-deposited nitride layer has greater uniformity than the pad nitride layer that has undergone the formation of the deep trench. An isolation recess and a recess extension are then formed at one side of the deep trench and then filled with an isolation dielectric. In this process, the re-deposited nitride layer can be utilized to control the height and flatness of a top surface of the isolation dielectric, thus ensuring effective isolation of the polysilicon from a word line.

11 Claims, 7 Drawing Sheets

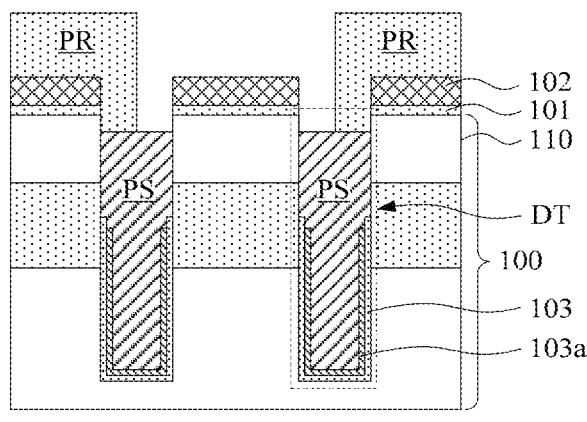
Fig. 1
(Prior Art)
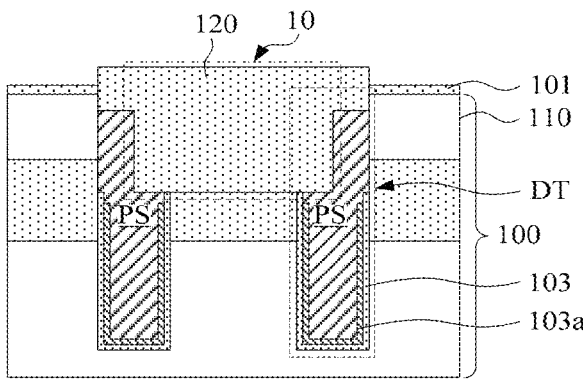
Fig. 2
(Prior Art)
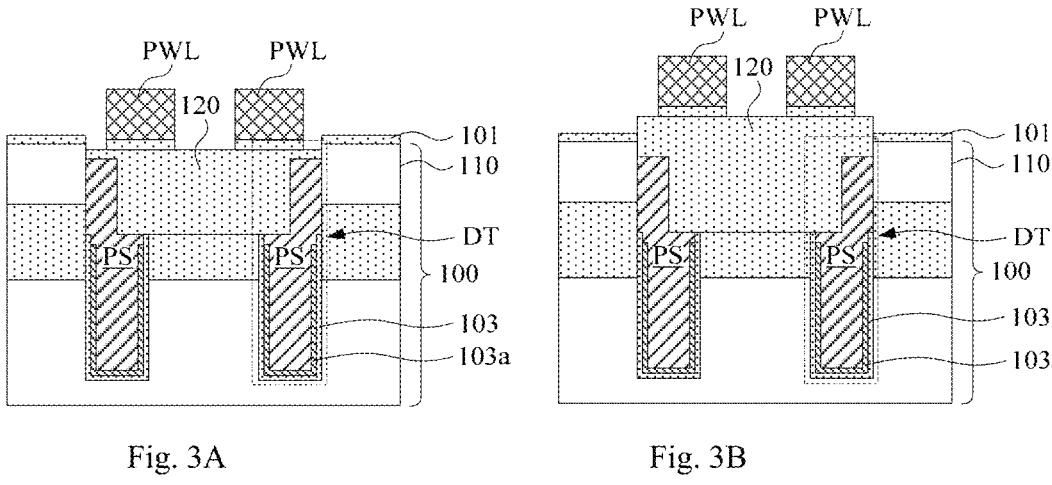
Fig. 3A
(Prior Art)
Fig. 3B
(Prior Art)

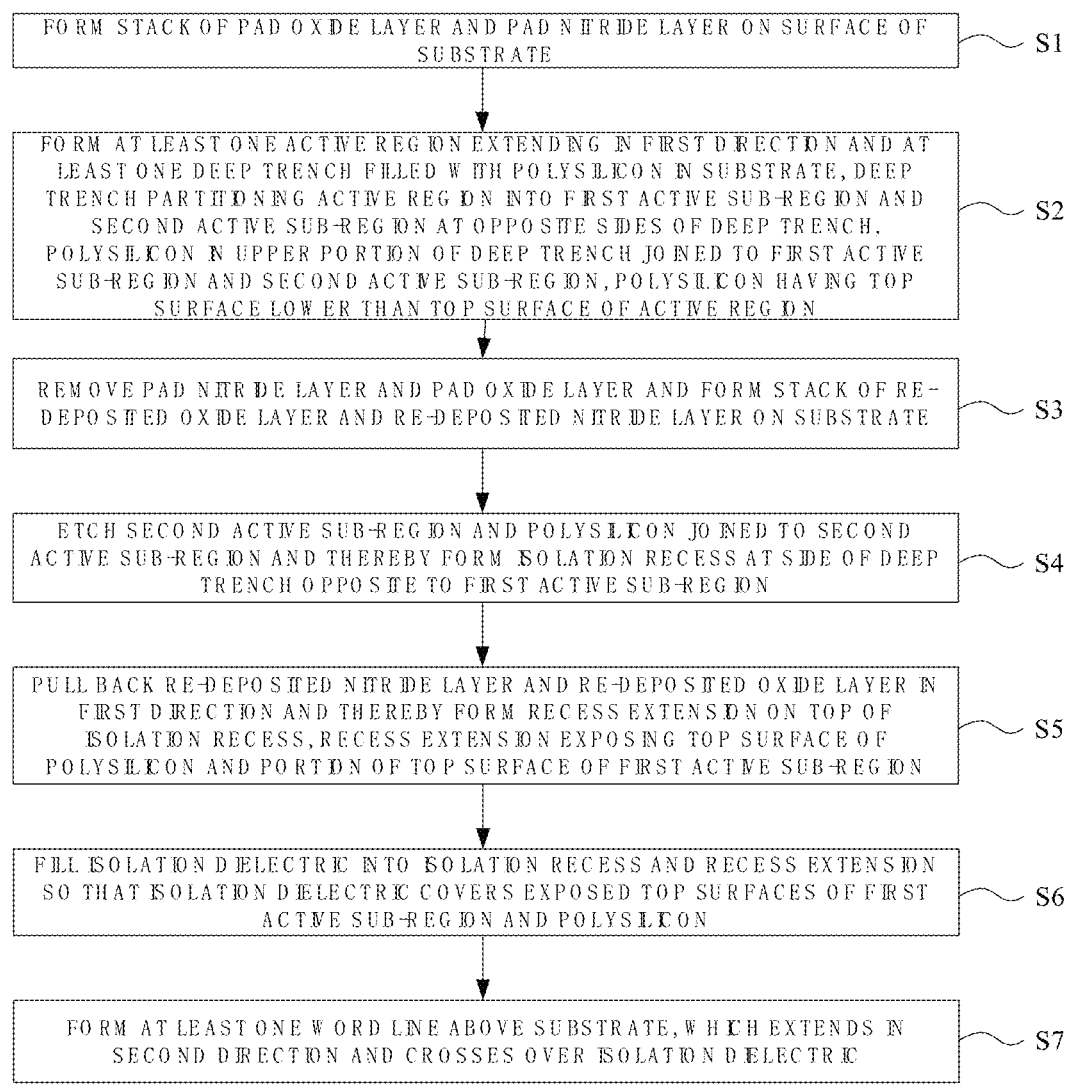

FORM STACK OF PAD OXIDE LAYER AND PAD NITRIDE LAYER ON SURFACE OF SUBSTRATE — S1

FORM AT LEAST ONE ACTIVE REGION EXTENDING IN FIRST DIRECTION AND AT LEAST ONE DEEP TRENCH FILLED WITH POLYSILICON IN SUBSTRATE, DEEP TRENCH PARTITIONING ACTIVE REGION INTO FIRST ACTIVE SUB-REGION AND SECOND ACTIVE SUB-REGION AT OPPOSITE SIDES OF DEEP TRENCH, POLYSILICON IN UPPER PORTION OF DEEP TRENCH JOINED TO FIRST ACTIVE SUB-REGION AND SECOND ACTIVE SUB-REGION, POLYSILICON HAVING TOP SURFACE LOWER THAN TOP SURFACE OF ACTIVE REGION — S2

REMOVE PAD NITRIDE LAYER AND PAD OXIDE LAYER AND FORM STACK OF RE-DEPOSITED OXIDE LAYER AND RE-DEPOSITED NITRIDE LAYER ON SUBSTRATE — S3

ETCH SECOND ACTIVE SUB-REGION AND POLYSILICON JOINED TO SECOND ACTIVE SUB-REGION AND THEREBY FORM ISOLATION RECESS AT SIDE OF DEEP TRENCH OPPOSITE TO FIRST ACTIVE SUB-REGION — S4

PULL BACK RE-DEPOSITED NITRIDE LAYER AND RE-DEPOSITED OXIDE LAYER IN FIRST DIRECTION AND THEREBY FORM RECESS EXTENSION ON TOP OF ISOLATION RECESS, RECESS EXTENSION EXPOSING TOP SURFACE OF POLYSILICON AND PORTION OF TOP SURFACE OF FIRST ACTIVE SUB-REGION — S5

FILL ISOLATION DIELECTRIC INTO ISOLATION RECESS AND RECESS EXTENSION SO THAT ISOLATION DIELECTRIC COVERS EXPOSED TOP SURFACES OF FIRST ACTIVE SUB-REGION AND POLYSILICON — S6

FORM AT LEAST ONE WORD LINE ABOVE SUBSTRATE, WHICH EXTENDS IN SECOND DIRECTION AND CROSSES OVER ISOLATION DIELECTRIC — S7

Fig. 4

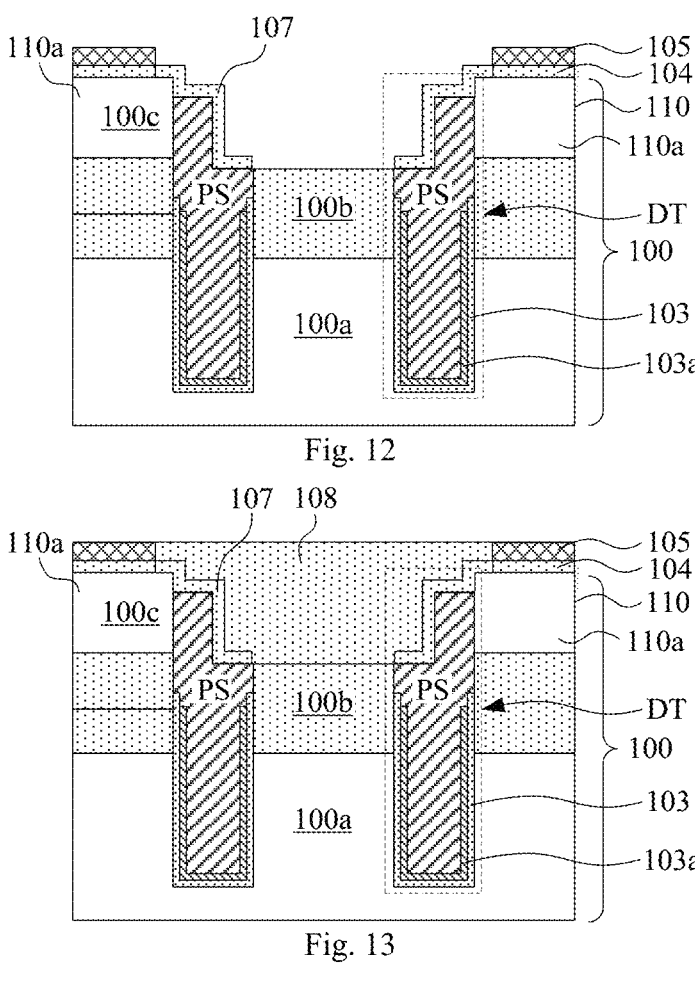
Fig. 12
Fig. 13
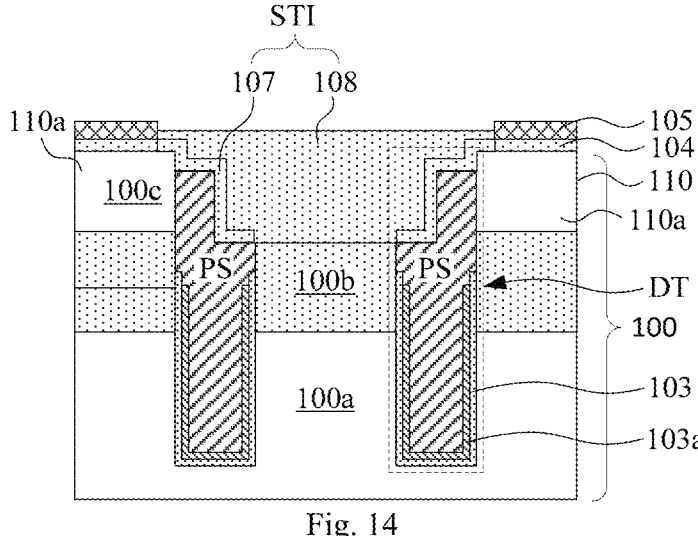
Fig. 14 eDRAM AND METHOD FOR MAKING SAME

CROSS-REFERENCE TO RELATED APPLICATION

This application claims the priority of Chinese patent application number 202311314986.5, filed on Oct. 10, 2023, and entitled "EDRAM AND METHOD FOR MAKING SAME", the entire contents of which are incorporated herein by reference.

TECHNICAL FIELD

The present invention relates to the field of semiconductor technology and, in particular, to an embedded dynamic random-access memory (eDRAM) and a method for making the eDRAM.

BACKGROUND

Deep trench capacitors (DTCs) may be formed before MOSFETs, without affecting the MOSFETs' properties. Therefore, dynamic random-access memory (DRAM) employing DTCs may be integrated on the same wafer as logic circuit. Such DRAM is known as embedded DRAM (eDRAM). An eDRAM cell generally includes one or more DTCs and one or more two-dimensional (2D) MOSFETs or FinFETs coupled thereto.

FIG. 1 is a cross-sectional view of a structure resulting from filling deep trenches DT in a substrate 100 with polysilicon PS using a conventional technique. Referring to FIG. 1, in the conventional technique, before the deep trenches DT are formed in the substrate 100, a pad oxide layer 101 and a pad nitride layer 102 are usually stacked over the surface of the substrate 100. After active areas 110 and the deep trenches DT are formed in the substrate 100, the deep trenches DT are lined with a dielectric layer 103, and the polysilicon PS is filled therein, optionally with a barrier layer 103a (e.g., titanium nitride (TiN)) being sandwiched between the dielectric layer 103 and the polysilicon layer PS. An etching process follows to partially remove the polysilicon PS so that its top surface is lower than that of the active areas 110 on both sides. After that, with photoresist PR serving as a mask, another etching process is performed on the active areas 110 and the polysilicon PS between adjacent deep trenches DT. Referring to FIG. 2, as a result of the etching process, isolation recesses 10 are formed between adjacent deep trenches DT, and an isolation dielectric 120 is deposited into the isolation recesses 10 and on the top surface of the polysilicon PS, followed by planarization using a chemical mechanical polishing (CMP). The polishing process stops at the pad nitride layer 102, and the pad nitride layer 102 is then stripped away.

FIGS. 3A and 3B are cross-sectional view of a conventional structure resulting from forming word lines WL over the substrate 100. Referring to FIGS. 3A and 3B, a plurality of word lines WL are formed over the substrate 100 to form gates of transistors in the active areas 110. In particular, the word lines WL may be passing word line (PWLs) formed on the isolation dielectric 120. However, due to poor uniformity of, and possible presence of local voids in the pad nitride layer 102 during the formation of the isolation dielectric 120, after the CMP process, the isolation dielectric 120 may have a varying height across the substrate 100, as shown in FIGS. 3A and 3B. Consequently, apart from possible inconsistent and instable performance of the resulting memory cells located in different areas, and serious parasitic capacitance, or even a short-circuit problem may occur, due to extreme thinness of the isolation dielectric 120 and hence extreme proximity between the polysilicon PS and some passing word lines (PWLs) on the isolation dielectric 120, which is detrimental to eDRAM performance and yield.

SUMMARY OF THE INVENTION

The present invention seeks to provide an eDRAM with a more uniformly filled isolation dielectric in isolation recesses formed at side walls of deep trenches and with assured effective isolation between polysilicon in the deep trenches and word lines formed above the isolation dielectric, as well as a method for making such an eDRAM.

In one aspect of the present invention, there is provided a method for making an eDRAM, which comprises:

forming a stack of a pad oxide layer and a pad nitride layer above a surface of a substrate;

forming, in the substrate, at least one active area extending in a first direction and at least one deep trench filled with polysilicon, wherein each deep trench partitions the active area into a first active sub-region and a second active sub-region at opposite sides of the deep trench, the polysilicon in an upper portion of the deep trench joined to the first active sub-region and the second active sub-region, the polysilicon having a top surface lower than a top surface of the active area;

removing the pad nitride layer and the pad oxide layer;

forming a stack of a re-deposited oxide layer and a re-deposited nitride layer above the substrate;

etching the second active sub-region and the polysilicon joined to the second active sub-region, thereby forming an isolation recess at a first side of the deep trench opposite to the first active sub-region;

pulling back the re-deposited nitride layer and the re-deposited oxide layer in the first direction, thereby forming a recess extension on a top of the isolation recess, the recess extension exposing the top surface of the polysilicon and a portion of a top surface of the first active sub-region;

filling an isolation dielectric into the isolation recess and the recess extension, wherein the isolation dielectric covers the exposed top surfaces of the first active sub-region and the polysilicon; and forming at least one word line above the substrate, which extends in a second direction and crosses over the isolation dielectric.

In another aspect of the present invention, an eDRAM formed according to the method as defined above is provided. The eDRAM comprises:

a substrate, in which a first active sub-region extending in a first direction is formed;

at least one deep trench in the substrate, which is filled with polysilicon, wherein: the first active sub-region is at one side of the deep trench the polysilicon is joined to the first active sub-region; and the polysilicon has a top surface lower than a top surface of the first active sub-region;

an isolation recess formed at the other side of the deep trench and a recess extension on a top of the isolation recess, wherein each of the isolation recess and the recess extension is filled with an isolation dielectric, wherein the isolation dielectric covers a portion of a top surface of the first active sub-region and the top surface of the polysilicon; and a word line formed above the substrate and extending in a second direction, wherein the word line crosses over the isolation dielectric.

In the method provided herein, the pad oxide layer and the pad nitride layer are removed after the active area and the deep trench filled with the polysilicon are formed, followed by the formation of the re-deposited oxide layer and the re-deposited nitride layer. The re-deposited nitride layer has greater uniformity than the pad nitride layer that has undergone the formation of the deep trench. The isolation recess and the recess extension are then formed at one side of the deep trench and then filled with the isolation dielectric. In this process, the re-deposited nitride layer can be utilized to control the height and flatness of the top surface of the isolation dielectric, ensuring effective isolation of the polysilicon from the word line and hence improved performance and yield of the resulting eDRAM. In the eDRAM sought to be protected hereby, which is fabricated according to the method provided herein, the isolation dielectric has a flat top surface and a uniform thickness across its entire extent. Moreover, the polysilicon is effectively isolated from the word line. These enable the eDRAM to have improved performance and yield.

BRIEF DESCRIPTION OF THE DRAWINGS

FIG. 1 is a schematic cross-sectional view of polysilicon-filled deep trenches formed in a substrate using a conventional technique.

FIG. 2 is a schematic cross-sectional view of a structure resulting from forming isolation recesses between adjacent deep trenches and filling them with an isolation dielectric in the conventional technique.

FIGS. 3A and 3B are schematic cross-sectional views of different areas of a structure resulting from forming word lines over the substrate in the conventional technique.

FIG. 4 is a schematic flow diagram of a method for making an eDRAM according to an embodiment of the present invention.

FIG. 10A is a schematic cross-sectional view of a structure resulting from the formation of a second mask layer in a method for making an eDRAM according to an embodiment of the present invention.

FIG. 10B is a schematic plan view of a structure resulting from the formation of a second mask layer in a method for making an eDRAM according to an embodiment of the present invention.

FIGS. 11 to 15 are schematic cross-sectional views of structures resulting from steps in a method for making an eDRAM according to an embodiment of the present invention.

FIG. 16A is a schematic plan view of a structure resulting from the formation of word lines over a substrate in a method for making an eDRAM according to an embodiment of the present invention.

FIG. 16B is a schematic cross-sectional view taken along line AA' in FIG. 16A.

DETAILED DESCRIPTION

EDRAMs and methods according to specific embodiments of the present invention will be described in greater detail below with reference to the accompanying drawings. It is understood that the figures are provided in a very simplified form not necessarily drawn to exact scale and only for the sake of easier and clearer description of the embodiments. Additionally, as used herein, spatially relative terms are intended to encompass different orientations of the device in use or operation in addition to the orientation depicted in the figures. For example, if the device in the figures is inverted or otherwise oriented (e.g., rotated), the exemplary term "over" can encompass an orientation of "under" and other orientations.

Embodiments of the present invention are directed to a method for forming an eDRAM and an eDRAM fabricated according to the method. The eDRAM fabricated according to this method includes deep trench capacitors (DTCs), which can provide relatively large capacitance. More specifically, the eDRAM may include two-dimensional (2D) MOSFETs coupled to the DTCs. With this method, various problems arising from poor uniformity of, and possible presence of local voids in a pad nitride layer in a conventional technique, may be improved. The method will be illustrated and described below with reference to FIGS. 4 to 16B.

Figures 5A, 5B, 6:
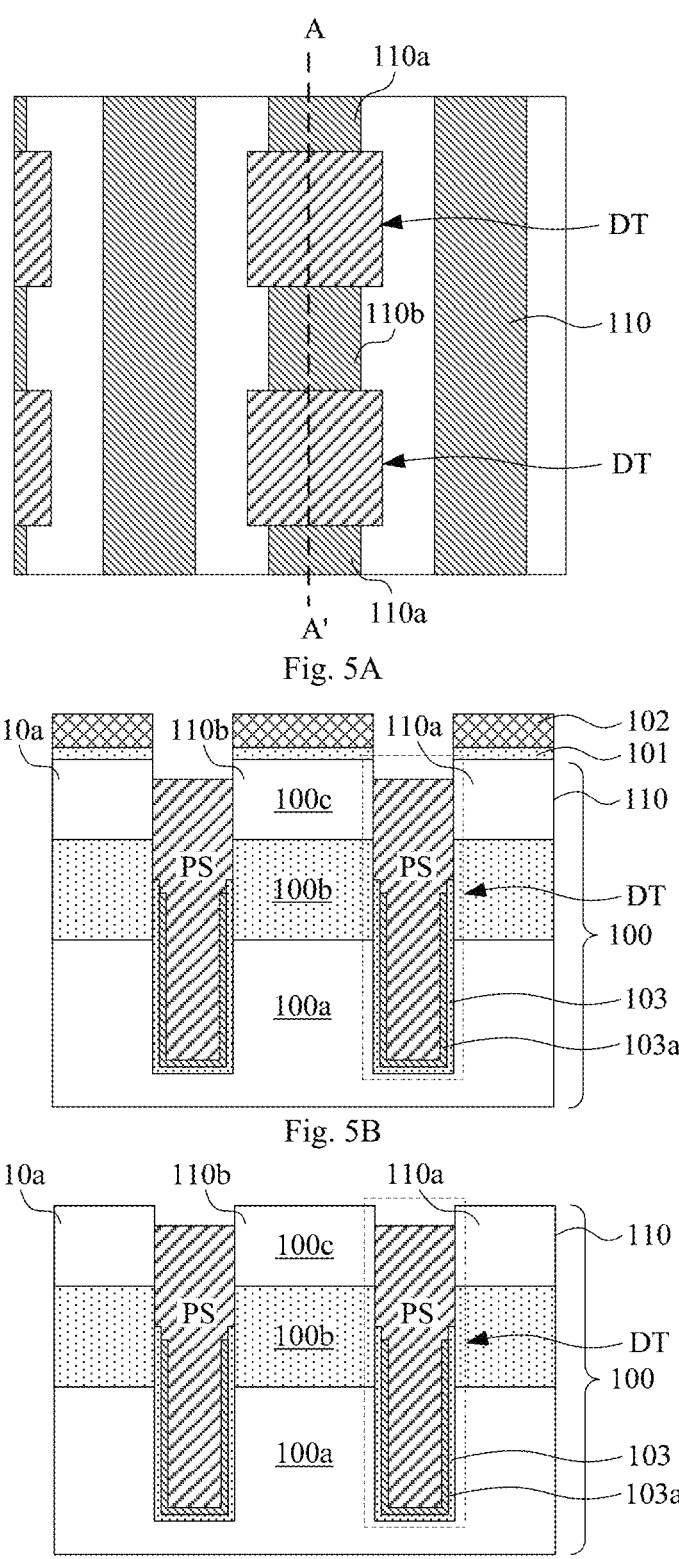
FIG. 5A is a schematic plan view of active areas and polysilicon-filled deep trenches formed in a method for making an eDRAM according to an embodiment of the present invention.
FIG. 5B is a schematic cross-sectional view taken along line AA' in FIG. 5A.
FIGS. 6 to 9 are schematic cross-sectional views of structures resulting from steps in a method for making an eDRAM according to an embodiment of the present invention.

FIGS. 5A and 5B are plan and cross-sectional views, respectively, of active areas 110 and deep trenches DT filled with polysilicon PS, which are formed in a substrate 100. Referring to FIGS. 4, 5A and 5B, according to an embodiment of the present invention, in step S1 of the method, a stack of a pad oxide layer 101 and a pad nitride layer 102 is formed on a surface of a substrate 100. In step S2, at least one active area 110 extending in a first direction and at least one deep trench DT filled with polysilicon PS are formed in the substrate.

For example, the substrate 100 may be a silicon-on-insulator (SOI) substrate including a doped substrate layer 100a, a buried oxide layer 100b overlying the doped substrate layer 100a and a device layer 100c located on the buried oxide layer 100b. For example, the doped substrate layer 100a may be a heavily-doped P-type silicon substrate. For example, the buried oxide layer 100b may be a silicon oxide layer. For example, the device layer 100c may be a P-type doped silicon layer.

The active area 110 may be defined by an isolation (e.g., shallow trench isolation (STI)) structure formed in the substrate 100. The isolation structure may be formed according to any suitable disclosed method, and the formation may involve an etching process, in which the pad oxide layer 101 and the pad nitride layer 102 may serve as a hard mask. In embodiments where the device layer 100c is silicon, the pad oxide layer 101 may be, for example, a silicon oxide layer, and the pad nitride layer 102 may be, for example, a silicon nitride layer.

The first direction may be defined by line AA' in FIG. 5A. FIG. 5B is a schematic cross-sectional view taken along line AA' in FIG. 5A. Referring to FIGS. 5A and 5B, the deep trench DT may be, for example, formed after the active area 110 has been formed. The deep trench DT may extend through the device layer 100c and the buried oxide layer 100b into the doped substrate layer 100a. The deep trench DT may be formed according to any suitable disclosed method, and the formation may involve an etching process, in which the pad oxide layer 101 and the pad nitride layer 102 may serve as a hard mask. For example, each deep trench DT may traverse one active area 110. As an example, each active area 110 may be partitioned by multiple deep trenches DT. Each deep trench DT may partition one active area 110 into a first active sub-region 110a and a second active sub-region 110b located at opposite sides of the corresponding deep trench DT. As shown in FIG. 5A, as an example, a plurality of deep trenches DT may be formed in the substrate 100, and every adjacent deep trenches DT may partition a single active area 110 and share a second active sub-region 110b.

The deep trench DT is used to form the DTC. In the first active sub-region 110a, a MOSFET coupled to the DTC located at a corresponding deep trench DT is to be formed. After the formation of the deep trench DT, the deep trench DT may be lined with a dielectric layer 103, and polysilicon PS may be filled therein. The dielectric layer 103 may cover a surface of the doped substrate layer 100a exposed in the deep trench DT, as well as a portion of a surface of the buried oxide layer 100b exposed in the deep trench DT. Optionally, prior to the filling of the polysilicon PS, a barrier layer 103a (which may include titanium (Ti), titanium nitride (TiN), tantalum nitride (TaN) or the like) may be formed over a surface of the dielectric layer 103. The barrier layer 103a may serve to block diffusion of dopant ions from the polysilicon PS into the dielectric layer 103. The filling of the deep trench DT with the polysilicon PS may involve depositing the polysilicon so that it fills up the deep trench DT and covers a surface of the pad nitride layer 102 outside of the deep trench DT and then partially etching away the polysilicon so that its top surface is lower than a top surface of the active area 110. As shown in FIG. 5B, the polysilicon PS in an upper portion of the deep trench DT is joined to the first active sub-region 110a and the second active sub-region 110b located at opposite sides of the deep trench DT. The polysilicon PS may be doped by in-situ doping or ion implantation.

Figures 7, 8, 9:
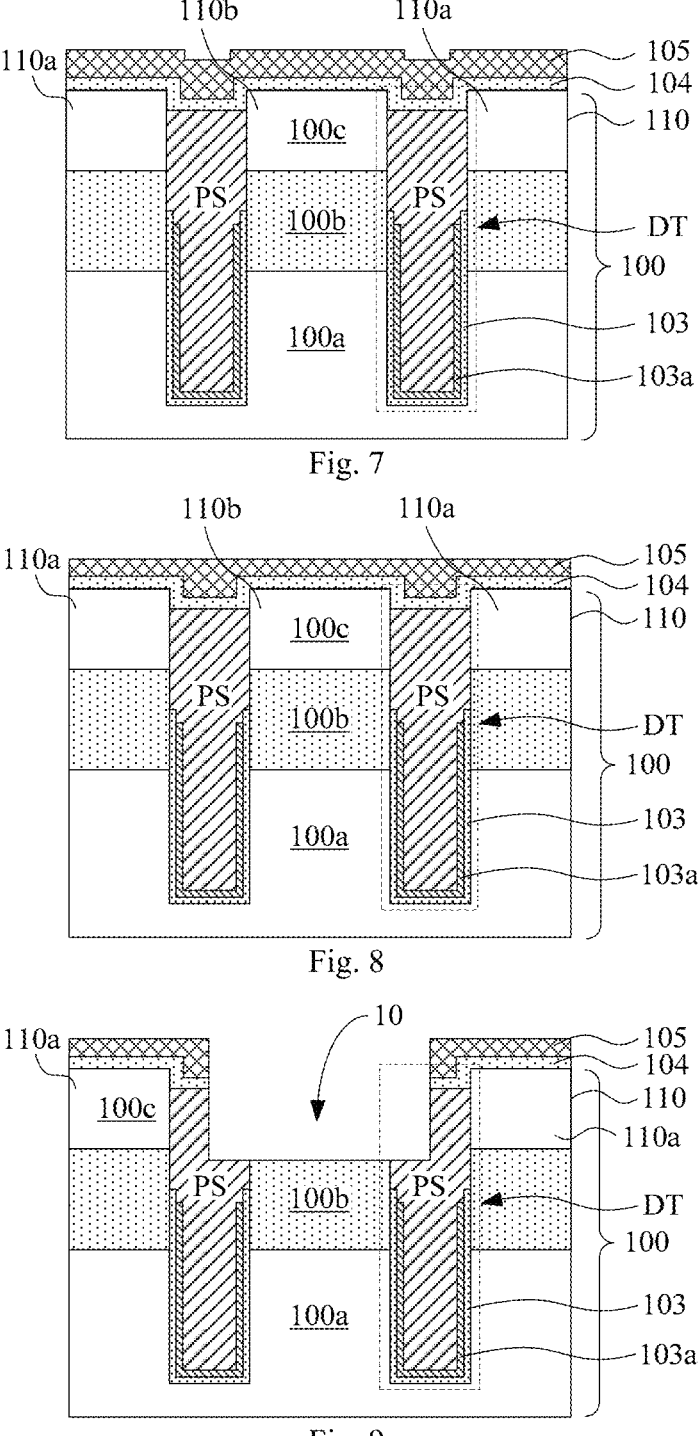

Since the pad nitride layer 102 is formed earlier than the active area 110, the pad nitride layer 102 will show poor thickness uniformity and integrity and is therefore removed after the polysilicon PS is filled in the deep trench DT. FIG. 6 is a cross-sectional view of a structure resulting from removing the pad oxide layer 101 and the pad nitride layer 102. FIG. 7 is a cross-sectional view of a structure resulting from the formation of a re-deposited oxide layer 104 and a re-deposited nitride layer 105. Referring to FIGS. 4, 6 and 7, according to embodiments of the present invention, in step S3 of the method, the pad nitride layer 102 and the pad oxide layer 101 are removed, followed by the formation of the stacked re-deposited oxide layer 104 and re-deposited nitride layer 105 over the substrate 100.

For example, the re-deposited oxide layer 104 may be silicon oxide and formed using an atomic layer deposition (ALD) process. For example, the re-deposited nitride layer 105 may be silicon nitride and formed using a chemical gas deposition (CVD) process. As shown in FIG. 7, for example, the stacked re-deposited oxide layer 104 and re-deposited nitride layer 105 may cover the surface of the substrate 100 with the polysilicon PS having been filled in the deep trench DT.

FIG. 8 is a cross-sectional view of a structure resulting from a CMP process performed on the re-deposited nitride layer 105. As shown in FIG. 8, a CMP process may be optionally performed to flatten a top surface of the re-deposited nitride layer 105.

Referring to FIG. 4, in step S4, an etching process is performed on the second active sub-region 110b and the polysilicon PS joined to the second active sub-region 110b to form an isolation recess at the side of the deep trench DT opposite to the first active sub-region 110a (i.e., the resulting isolation recess and the first active sub-region 110a are located at opposite sides of the deep trench DT).

FIG. 9 shows a cross-sectional view of a structure resulting from the formation of the isolation recess 10. Referring to FIG. 9, in step S4, first of all, a first mask layer is formed on the surface of the re-deposited nitride layer 105 and patterned to define the isolation recess. For example, the first mask layer may include an organic planarization layer (OPL) covering the re-deposited nitride layer 105, a bottom anti-reflection coating (BARC) layer covering the OPL layer and a photoresist layer located on the BARC layer. After that, with the first mask layer serving as a mask, an etching (e.g., dry etching) process is performed on the second active sub-region 110b and the polysilicon PS in the deep trench DT, which is joined to the corresponding second active sub-region 110b. In this embodiment, as a result of the etching process, the second active sub-region 110b between adjacent deep trenches DT, as well as portions of the polysilicon PS in the adjacent deep trenches DT proximal to the second active sub-region 110b, is removed, resulting in the isolation recess 10 formed between the adjacent deep trenches DT. A surface of the polysilicon PS exposed in the isolation recess 10 is L-shaped. After that, the first mask layer is removed.

The isolation recess 10 is to be subsequently filled with an isolation dielectric, which isolates the polysilicon PS remaining in the deep trench DT from a word line to be subsequently formed so as to pass over the deep trench DT (i.e., a passing word line (PWL)). In this embodiment, the isolation recess 10, which is formed by forming the first mask layer on the re-deposited nitride layer 105 and then etching the second active sub-region 110b and the polysilicon PS in the deep trench DT, may have any desired depth.

The isolation recess 10 exposes the buried oxide layer 100b underlying the second active sub-region 110b and a side surface of the polysilicon PS located in an upper portion of the deep trench DT, the upper portion of the deep trench DT is joined to the first active sub-region 110a. The stacked re-deposited oxide layer 104 and re-deposited nitride layer 105 cover a surface of the first active sub-region 110a and the top surface of the polysilicon PS in the upper portion of the deep trench DT.

Referring to FIG. 4, in step S5, the re-deposited nitride layer 105 and the re-deposited oxide layer 104 are pulled back in the aforementioned first direction (which is a lengthwise direction of the active area 110 and defined by line AA'), forming a recess extension on top of the isolation recess 10, which exposes the top surface of the polysilicon PS and a portion of a top surface of the first active sub-region 110a.

Figures 10A, 10B, 11:
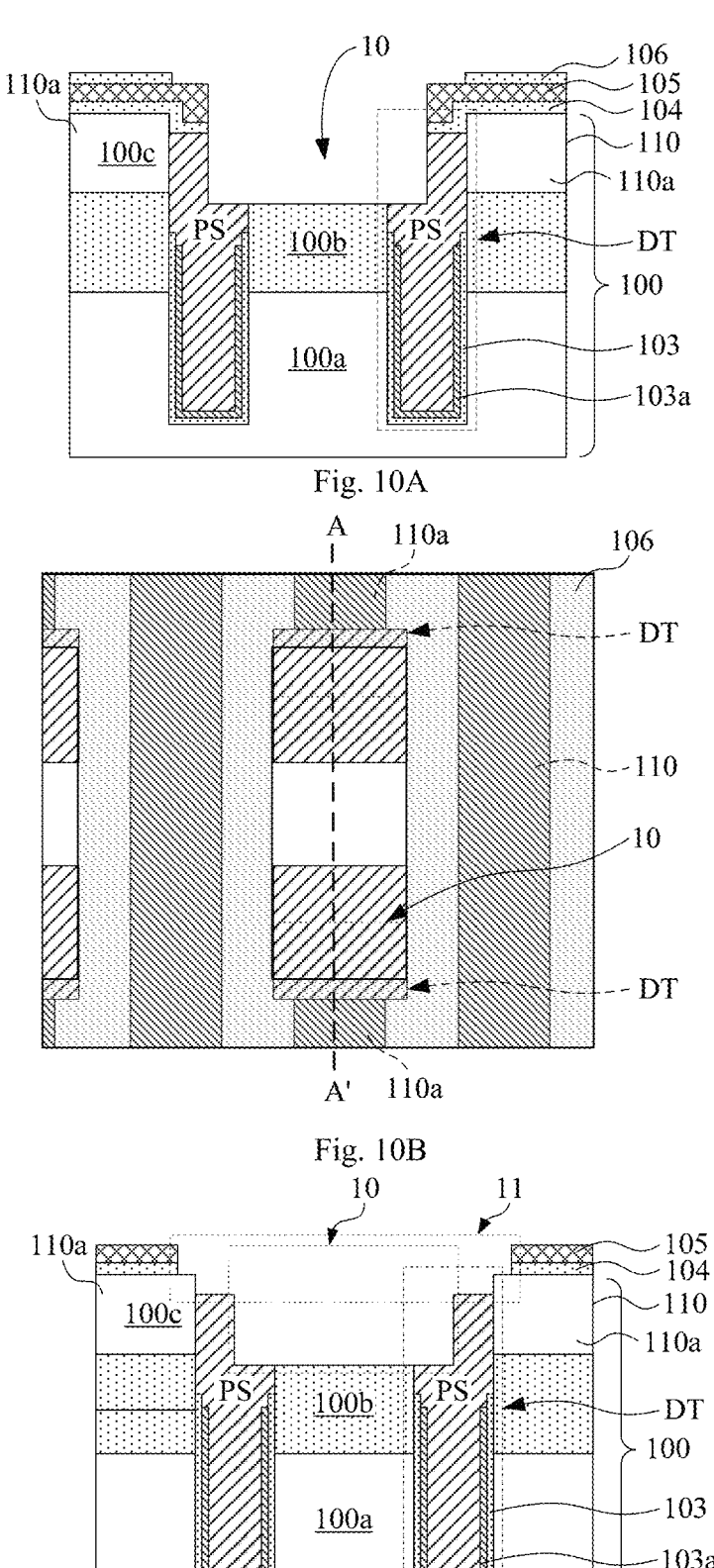

Specifically, a second mask layer may be first formed on the top surface of the re-deposited nitride layer 105 and patterned to define the recess extension. As an etching mask, the second mask layer may be implemented as any of known masks for this purpose. For example, the second mask layer may include photoresist and/or a hard mask. Referring to FIG. 10A, as an example, an atomic layer deposition or chemical gas deposition process may be carried out to form a first linear oxide layer 106, which extends over the top surface of the re-deposited nitride layer 105 and lines the isolation recess 10. Subsequently, a photoresist layer may be formed on the first linear oxide layer 106 and patterned to define the recess extension to be formed. Next, an etching process may be performed to transfer the pattern in the photoresist layer into the first linear oxide layer 106, followed by removal of the photoresist layer. This patterned first linear oxide layer 106 is shown in FIG. 10A and can serve as the second mask layer.

FIG. 10B shows a plan view of the second mask layer. Referring to FIGS. 10A and 10B, in this embodiment, serving as the second mask layer, the patterned first linear oxide layer 106 has an opening above the isolation recess 10, which is wider than the isolation recess 10 in the first direction (defined by line AA') and is substantially as wide as the isolation recess 10 in a direct perpendicular to the first direction.

After the patterned first linear oxide layer 106 is formed, the re-deposited nitride layer 105 is etched, for example, using a wet etching process using, for example, a phosphoric acid solution as an etchant, with the first linear oxide layer 106 serving as a mask. After the etching process is completed, the first linear oxide layer 106 is removed, as well as the exposed re-deposited oxide layer 104.

FIG. 11 is a cross-sectional view of a structure resulting from the formation of the recess extension 11. Referring to FIG. 11, after step S5, the recess extension 11 on top of the isolation recess 10 exposes the top surface of the polysilicon PS joined to the first active sub-region 110a, as well as a portion of a top surface of the first active sub-region 110a adjacent to the polysilicon PS. There are a height difference between the exposed top surface of the first active sub-region 110a and the top surface of the re-deposited nitride layer 105, another height difference between the exposed top surfaces of the first active sub-region 110a and the polysilicon PS, and yet another height difference between the top surface of the polysilicon PS and a bottom surface of the isolation recess 10. That is, inner wall of the isolation recess 10 and the recess extension 11 form multiple steps.

Referring to FIG. 4, in step S6, an isolation dielectric is filled into the isolation recess 10 and the recess extension 11, which covers the exposed top surfaces of the first active sub-region 110a and the polysilicon PS.

Figures 15, 16A, 16B:
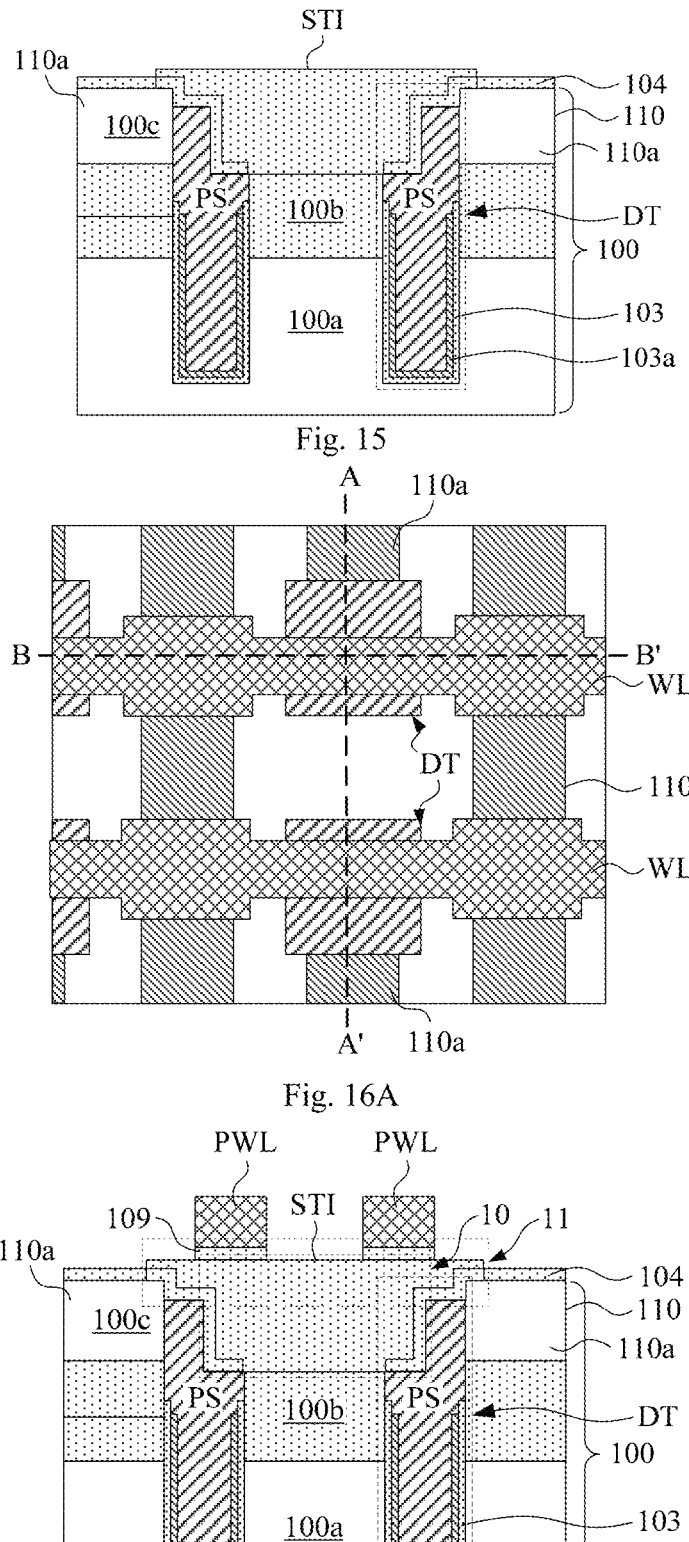

As an example, the filling of the isolation dielectric in the isolation recess 10 and the recess extension 11 may include: at first, as shown in FIG. 12, forming a second linear oxide layer 107 on the surfaces of the polysilicon PS and the first active sub-region 110a exposed in the isolation recess 10 and the recess extension 11 using a thermal oxidation or other process; and as shown in FIG. 13, then depositing a dielectric material 108, using a high-density plasma CVD (HDP-CVD) or other suitable process, into the isolation recess 10 and the recess extension 11 and onto the re-deposited nitride layer 105; and performing a CMP process to remove the dielectric material 108 above the re-deposited nitride layer 105 so that a top surface of the dielectric material 108 in the isolation recess 10 and the recess extension 11 is flush with the surface of the re-deposited nitride layer 105. In order to avoid the dielectric material 108 from being raised much over the first active sub-region 110a, optionally, as shown in FIG. 14, the dielectric material 108 may be etched to lower its top surface to a predetermined height. In this way, the remaining dielectric material 108 and the second linear oxide layer 107 make up the isolation dielectric STI, which fills up the isolation recess 10 and the recess extension 11, and covers a portion of a top surface of the first active sub-region 110a. As shown in FIG. 15, the re-deposited nitride layer 105 may be then stripped away. As a result of the etching process, the top surface of the isolation dielectric STI is about 1 nm to 5 nm higher than the top surface of the first active sub-region 110a. However, the present invention is not so limited, and the height difference may be set to any other desired value.

In this embodiment, in step S5, the re-deposited nitride layer 105 and the re-deposited oxide layer 104 are pulled back in the first direction to form the recess extension 11 on top of the isolation recess 10, which exposes the top surface of the polysilicon PS in the deep trench DT and a portion of a top surface of the first active sub-region 110a. Moreover, in step S6, the isolation dielectric STI is filled into the isolation recess 10 and the recess extension 11, which cover the exposed top surfaces of the first active sub-region 110a and the polysilicon PS. In this way, effective isolation can be provided between the polysilicon PS and a passing word line (PWL) to be subsequently formed above the isolation dielectric STI.

FIGS. 16A and 16B are plan and cross-sectional views, respectively, of a structure resulting from the formation of word lines WL over the substrate 100. Referring to FIGS. 4, 16A and 16B, in step S7, at least one word line WL extending in a second direction (defined by line BB' in FIG. 16A) is formed over the substrate 100. The word line WL crosses over the isolation dielectric STI filled in the isolation recess 10 and the recess extension 11.

The word line WL serves to provide a gate of a transistor in the eDRAM to be formed in the first active sub-region 110a. The word line WL may be a passing word line (PWL) crossing over the isolation dielectric STI. The word line WL may include at least one of conductive materials including metals, polysilicon, metal silicides and metal nitrides. A gate dielectric layer 109 may be optionally formed between the word line WL and the substrate 100, which includes at least one of silicon oxide, silicon oxynitride and a high-k material. Additionally, a work function metal layer may be formed between the gate dielectric layer 109 and the word line WL.

In the method discussed above, the pad oxide layer 101 and the pad nitride layer 102 are removed after the active area 110 and the deep trench DT filled with the polysilicon PS are formed, followed by the formation of the re-deposited oxide layer 104 and the re-deposited nitride layer 105. The re-deposited nitride layer 105 has greater uniformity than the pad nitride layer 102 that has undergone the formation of the deep trench. The isolation recess 10 and the recess extension 11 are then formed at one side of the deep trench DT and then filled with the isolation dielectric STI. In this process, the re-deposited nitride layer 105 can be utilized to control top surface flatness of the isolation dielectric STI and thickness of the isolation dielectric STI covering the surface of the first active sub-region 110a, ensuring effective isolation of the polysilicon PS in the deep trench DT from the passing word line (PWL) over the isolation dielectric STI and improved performance of the resulting eDRAM.

Embodiments of the present invention also relate to an eDRAM fabricated according to the method described in the foregoing embodiments. Referring to FIGS. 16A and 16B, the eDRAM includes:

a substrate 100, in which a first active sub-region 110a extending in a first direction (defined by line AA' in FIG. 16A) is formed;

at least one deep trench DT in the substrate 100, which is filled with polysilicon PS, and a first active sub-region 110a formed at one side of deep trench DT, the polysilicon PS joined to the first active sub-region 110a, the polysilicon PS having a top surface lower than a top surface of the first active sub-region 110a;

an isolation recess 10 formed at the other side of the deep trench DT and a recess extension 11 located on top of the isolation recess 10, the isolation recess 10 and the recess extension 11 filled with an isolation dielectric STI, the isolation dielectric STI covering a portion of a top surface of the first active sub-region 110a and the top surface of the polysilicon PS; and a word line WL formed on the substrate 100 and extending in a second direction (defined by line BB' in FIG. 16A), the word line WL crossing over the isolation dielectric STI. The word line WL is a passing word line PWL crossing over the isolation dielectric STI.

In this eDRAM fabricated according to the method as defined above, the isolation dielectric STI has a flat top surface and a uniform thickness across its entire extent. These enable the eDRAM to have improved performance and yield.

It is noted that the embodiments disclosed herein are described in a progressive manner, with the description of each embodiment focusing on its differences from others. Reference can be made between the embodiments for their identical or similar features.

The foregoing description is merely that of some preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method for making an embedded dynamic random-access memory (eDRAM), comprising:

forming a stack of a pad oxide layer and a pad nitride layer above a surface of a substrate;

forming, in the substrate, at least one active area extending in a first direction and at least one deep trench filled with polysilicon, wherein each deep trench partitions the active area into a first active sub-region and a second active sub-region at opposite sides of the deep trench, wherein the polysilicon in an upper portion of the deep trench is joined to the first active sub-region and the second active sub-region, and wherein the polysilicon has a top surface lower than a top surface of the active area;

removing the pad nitride layer and the pad oxide layer;

forming a stack of a re-deposited oxide layer and a re-deposited nitride layer above the substrate;

etching the second active sub-region and the polysilicon joined to the second active sub-region, thereby forming an isolation recess at a first side of the deep trench opposite to the first active sub-region;

pulling back the re-deposited nitride layer and the re-deposited oxide layer in the first direction, thereby forming a recess extension on a top of the isolation recess, wherein the recess extension exposes the top surface of the polysilicon and a portion of a top surface of the first active sub-region;

filling an isolation dielectric into the isolation recess and the recess extension, wherein the isolation dielectric covers the exposed top surfaces of the first active sub-region and the polysilicon; and forming at least one word line above the substrate, wherein the word line extends in a second direction and crosses over the isolation dielectric.

2. The method of claim 1, wherein the substrate is a silicon-on-insulator (SOI) substrate, wherein the SOI substrate comprises a doped substrate layer, a buried oxide layer over the doped substrate layer and a device layer over the buried oxide layer, and wherein the buried oxide layer is exposed at a bottom surface of the isolation recess.

3. The method of claim 1, wherein adjacent deep trenches partition a single active area and share the second active sub-region, wherein the isolation recess and the recess extension are formed between adjacent deep trenches.

4. The method of claim 1, further comprising, after the re-deposited nitride layer is formed on the substrate, performing a chemical mechanical polishing (CMP) process on a top surface of the re-deposited nitride layer.

5. The method of claim 1, wherein etching the second active sub-region and the polysilicon in the deep trench joined to the second active sub-region comprises:

forming a first mask layer on a surface of the re-deposited nitride layer, wherein the first mask layer comprises a pattern defining the isolation recess;

with the first mask layer serving as a mask, etching the second active sub-region at the first side of the deep trench and the polysilicon in the deep trench joined to the second active sub-region, thereby forming the isolation recess, wherein a surface of the polysilicon exposed in the isolation recess comprises an L shape; and removing the first mask layer.

6. The method of claim 1, wherein pulling back the re-deposited nitride layer and the re-deposited oxide layer in the first direction, thereby forming the recess extension on the top of the isolation recess comprises:

forming a second mask layer on a top surface of the re-deposited nitride layer, wherein the second mask layer comprises a pattern defining the recess extension;

with the second mask layer serving as a mask, etching the re-deposited nitride layer; and removing an exposed re-deposited oxide layer, thereby forming the recess extension on the top of the isolation recess.

7. The method of claim 6, wherein forming the second mask layer on the top surface of the re-deposited nitride layer comprises:

forming a first linear oxide layer covering the top surface of the re-deposited nitride layer and lining the isolation recess;

forming a photoresist layer on the first linear oxide layer, wherein the photoresist layer comprises a pattern defining the recess extension; and performing an etching process to transfer the pattern of the photoresist layer into the first linear oxide layer, and taking a patterned first linear oxide layer as the second mask layer, wherein after the re-deposited nitride layer is etched, the first linear oxide layer and the exposed re-deposited oxide layer are removed.

8. The method of claim 1, wherein filling the isolation dielectric into the isolation recess and the recess extension comprises:

forming a second linear oxide layer on surfaces of the polysilicon and the first active sub-region exposed in the isolation recess and the recess extension;

depositing a dielectric material into the isolation recess and the recess extension and onto the re-deposited nitride layer;

removing the dielectric material on the re-deposited nitride layer using a CMP process so that a top surface of the dielectric material in the isolation recess and the recess extension is flush with a surface of the re-deposited nitride layer; and etching the dielectric material to lower a top surface thereof to a predetermined height with respect to the first active sub-region, wherein the second linear oxide layer and a remaining dielectric material make up the isolation dielectric.

9. The method of claim 1, wherein the re-deposited nitride layer is removed after the isolation dielectric is filled in the isolation recess and before the word line is formed.

10. An embedded dynamic random-access memory (eDRAM) fabricated according to the method of claim 1, wherein the eDRAM comprises:

the substrate, in which the first active sub-region extending in the first direction is formed;

at least one deep trench in the substrate, which is filled with polysilicon, wherein:

the first active sub-region is at a second side of the deep trench;

the polysilicon is joined to the first active sub-region; and the polysilicon has the top surface lower than the top surface of the first active sub-region;

an isolation recess formed at the first side of the deep trench and the recess extension on the top of the isolation recess, wherein each of the isolation recess and the recess extension is filled with the isolation dielectric, wherein the isolation dielectric covers the portion of the top surface of the first active sub-region and the top surface of the polysilicon; and the word line formed above the substrate and extending in the second direction, wherein the word line crosses over the isolation dielectric.

11. The eDRAM of claim 10, wherein the substrate is a silicon-on-insulator (SOI) substrate, wherein the SOI substrate comprises a doped substrate layer, a buried oxide layer over the doped substrate layer and a device layer over the buried oxide layer, and wherein the buried oxide layer is exposed at a bottom surface of the isolation recess.

\* \* \* \* \*